United States Patent
Raj et al.

[11] Patent Number: 5,429,000
[45] Date of Patent: Jul. 4, 1995

[54] FERROFLUID PRESSURE SENSOR

[75] Inventors: Kuldip Raj, Merrimack; Ronald Moskowitz, Hollis, both of N.H.

[73] Assignee: Ferrofluidics Corporation, Nashua, N.H.

[21] Appl. No.: 171,230

[22] Filed: Dec. 21, 1993

[51] Int. Cl.[6] .............................................. G01L 9/00
[52] U.S. Cl. ......................................... 73/749; 73/728
[58] Field of Search .......................... 73/728, 722, 749; 324/207.13, 207.15, 207.18, 207.19, 207.20, 207.21

[56] References Cited

U.S. PATENT DOCUMENTS

| | | | |
|---|---|---|---|
| 3,108,213 | 10/1963 | Golder et al. | 324/207.19 |
| 3,697,867 | 10/1972 | Kleesattel | 324/207.15 |
| 4,170,498 | 10/1979 | Jost et al. | 73/722 |
| 4,351,191 | 9/1982 | Iwasaki | 73/728 |
| 4,395,711 | 7/1983 | Ward | 324/207.15 |
| 4,462,259 | 7/1984 | Stoltman et al. | 73/749 |
| 4,936,148 | 6/1990 | Shaw et al. | 73/728 |
| 5,205,214 | 6/1991 | Ross | 324/207.19 |
| 5,252,918 | 10/1993 | Van Berg et al. | 324/207.19 |

FOREIGN PATENT DOCUMENTS

| | | | |
|---|---|---|---|
| 2-157627 | 6/1990 | Japan | 73/722 |
| 4-286929 | 10/1992 | Japan | 73/722 |

*Primary Examiner*—Richard E. Chilcot, Jr.
*Assistant Examiner*—R. Biegel
*Attorney, Agent, or Firm*—Cesari and McKenna

[57] ABSTRACT

A differential pressure sensor includes a ferrofluid sensing element, or slug, that changes position in a tapered magnetic field in response to a pressure differential. The ferrofluid slug is contained in a tube and moves within the tapered magnetic field, which is perpendicular to the longitudinal axis of the tube. The field has a maximum flux density at its center and tapers off in both axial directions from its center. In response to a pressure differential of zero, the slug is centered in the field. In response to a non-zero pressure differential, the slug moves to the position in the field where the net magnetic forces equal the pressure differential. The position of the slug is sensed by sensing elements which produce output signals that vary according to the position of the slug. In a preferred embodiment the sensing elements are pickup coils that are positioned to encompass the range of movement of one end of the slug, or are a pair of pickup coils positioned, respectively, to encompass the range of movement of the two ends of the slug. The ferrofluid slug thus acts as a movable core for the pickup coil(s). As the ferrofluid slug moves, it changes the relative inductances of the pickup coils. The one coil or the pair of coils are connected in a bridge circuit, which produces an output signal that varies according to the changing inductances, and thus, the pressure differential.

9 Claims, 3 Drawing Sheets

FERROFLUID PRESSURE SENSOR

FIELD OF THE INVENTION

This invention relates generally to a pressure sensor, and more particularly, to a pressure sensor which uses a magnetic fluid as a pressure-sensing element.

BACKGROUND OF THE INVENTION

Pressure sensors, or transducers, sense absolute or differential pressure and produce a corresponding output signal. The pressure sensors may, for example, use differential capacitors or electromechanical mechanisms as sensing elements. The current invention uses a magnetic fluid as the sensing element.

A prior pressure transducer uses a magnetic fluid in a tube disposed in a strong magnetic field. In essence the fluid functions as a diaphragm, or membrane, that deforms in response to changes in the differential pressure at opposite ends of the tube. The resulting changes in the shape of the fluid membrane are converted to an electrical output indicative of the differential pressure.

The use of a magnetic fluid as the sensing element has certain advantages. The magnetic fluid is essentially free of static frictional forces, which tend to introduce inaccuracies into sensors with electromechanical mechanisms. Further, the magnetic fluid is not damaged by pressures above the pressure capacity of the sensor. The invention utilizes a magnetic fluid sensing element in a manner that is not contemplated by known prior sensors.

SUMMARY OF THE INVENTION

A differential pressure sensor incorporating the invention includes a ferrofluid slug disposed in a magnetic field provided by a magnet with tapered pole pieces. The longitudinal position of the ferrofluid slug corresponds to a difference in the pressures at its two ends. One or more sensing elements sense the position of the slug, and thereby provide an electrical output indicative of the pressure difference. In a preferred embodiment the sensing elements are pickup coils and the ferrofluid slug acts essentially as a movable core for these coils.

Briefly, the ferrofluid slug is contained in a tube which is positioned in the magnetic field, such that its axis is perpendicular to the flux lines of the field. The magnetic field is tapered, with maximum flux density at its center and decreasing densities at points farther from the center. Preferably, the field is symmetric with respect to the center. Accordingly, when the pressures at the two ends of the tube are equal, the ferrofluid slug is centered in the magnetic field. When the pressures at the ends differ, the ferrofluid slug is displaced toward the lower pressure, to a position where the net magnetic force is equal and opposite to forces resulting from the pressure difference.

As the ferrofluid slug is displaced, it changes the inductance of at least one pickup coil. If the slug moves within two of the coils, it changes the inductances of each of the coils, though in opposite senses. In a preferred embodiment the coil or coils are connected to a bridge circuit which, in response to an applied voltage, produces an output signal that varies with changes in differential pressure. In an alternative embodiment the coils are components of oscillator circuits, such that the changes in inductances shift the resonant frequencies of the circuits.

The sensing elements may be, instead of pickup coils, Hall effect sensors or a light source and photodiodes. Each of these sensing elements senses the position of the ferrofluid slug and produces an output signal indicative of that position. Accordingly, as the ferrofluid slug is displaced with changes in differential pressure, the output signals of these elements vary, also.

BRIEF DESCRIPTION OF THE DRAWINGS

The above and further advantages of the invention may be better understood by referring to the following description in conjunction with the accompanying drawings, in which.

DETAILED DESCRIPTION

Figure 1:
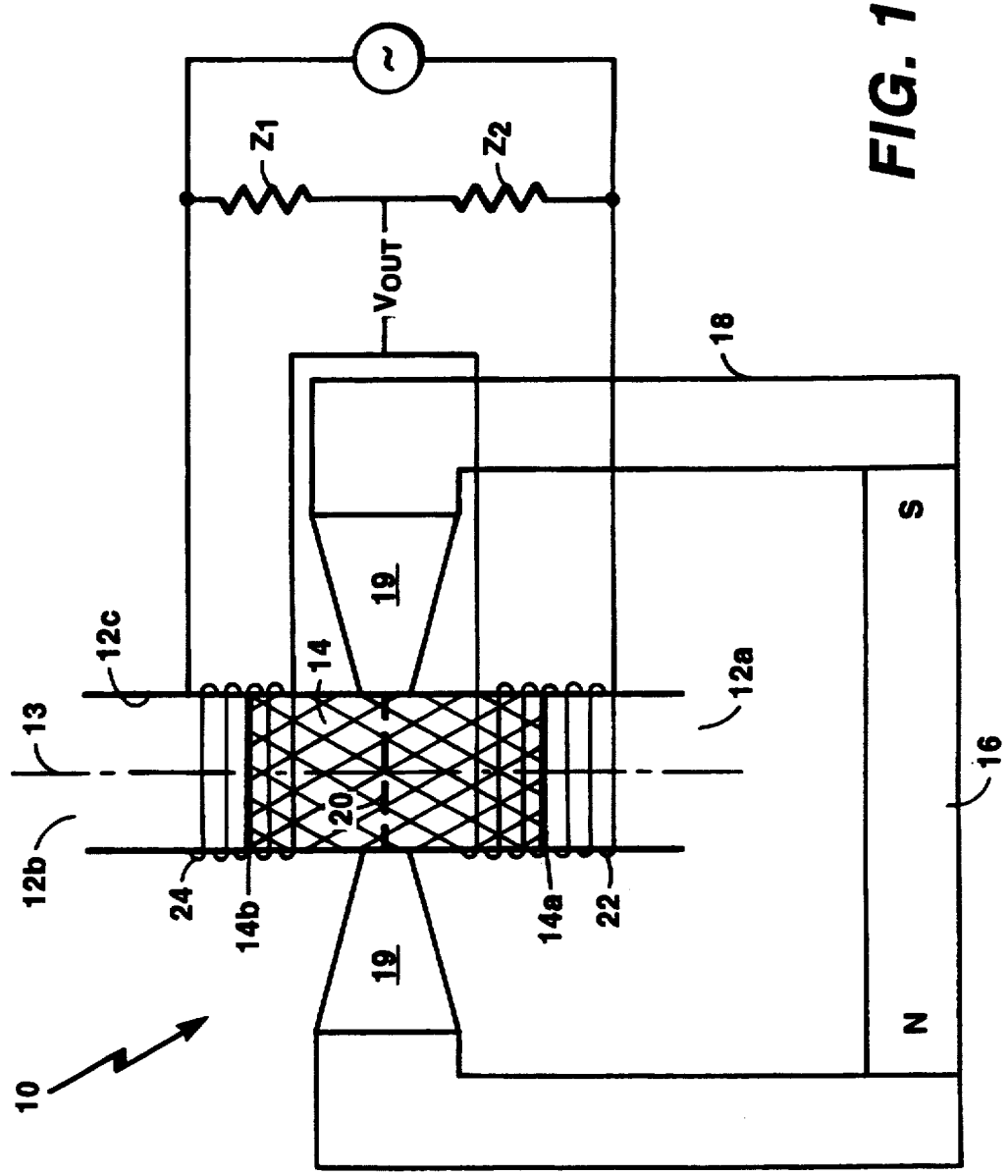
FIG. 1 depicts a pressure sensor, constructed in accordance with the invention, at equilibrium pressure.

FIG. 1 depicts, in block diagram form, a differential pressure sensor 10 that produces a signal corresponding to a pressure differential at the ends 12a and 12b of a nonmagnetic tube 12. The tube 12 contains a ferrofluid slug 14 that is displaced within a magnetic field generated by a magnet 16, by forces associated with the pressures in the tube ends 12a and 12b. One or more sensing elements, shown here as pickup coils 22 and 24, respond to the displacement of the slug 14, as described below.

The magnet 16 has pole pieces 18 with tapered ends 19. The magnet produces a magnetic field that is generally perpendicular to axis 13 of the tube 12, has a maximum at the tapered end 19 of the pole pieces 18 and tapers off in both directions from the center along the axis 13. Preferably, the field is symmetric with respect to a center line 20, such that when the pressures at the ends of the tube are equal, the slug 14 is centered in the magnetic field. In response to a pressure differential the ferrofluid slug 14 moves within the magnetic field, away from the center of the field.

Figure 2:
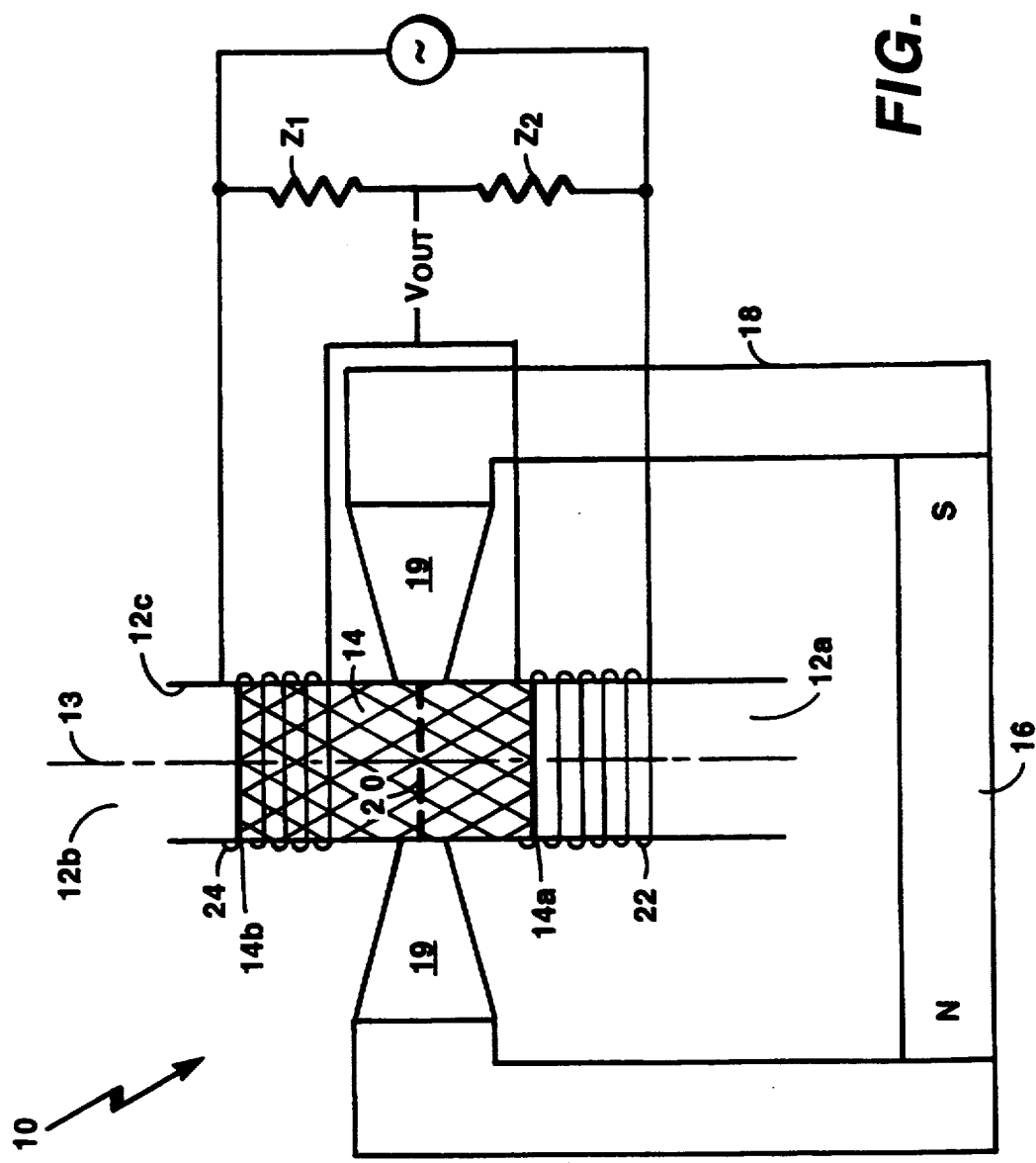
FIG. 2 depicts the sensor of FIG. 1 responding to a pressure differential.

The pickup coils 22 and 24 are wound around the tube 12, such that each coil encompasses the range of movement of one end of the ferrofluid slug 14. The ferrofluid slug 14 is thus a movable core for each of the coils. As the ferrofluid slug 14 moves in response to a pressure differential, the slug occupies a greater portion of one coil and a lesser portion of the other coil, as depicted in FIG. 2. This increases the inductance of the first coil and decreases the inductance of the other. Alternatively, the sensor may include a single pickup coil, as discussed below.

The coils 22 and 24 may be, for example, connected in a bridge circuit 26, as shown in FIG. 1. In response to an applied voltage, the bridge circuit 26 produces an output voltage which varies in accordance with changes in the relative inductances of the coils. If a single coil is used, for example, coil 22, the bridge circuit includes, in place of coil 24, a coil of known inductance. This bridge circuit similarly produces an output voltage that varies as the inductance of coil 22 changes with the movement of the ferrofluid slug 14.

In the alternative, the coils 22 and 24 may be components of oscillator circuits (not shown). The resonant frequencies of these oscillator circuits change, in response to changes in differential pressure.

Figure 3:
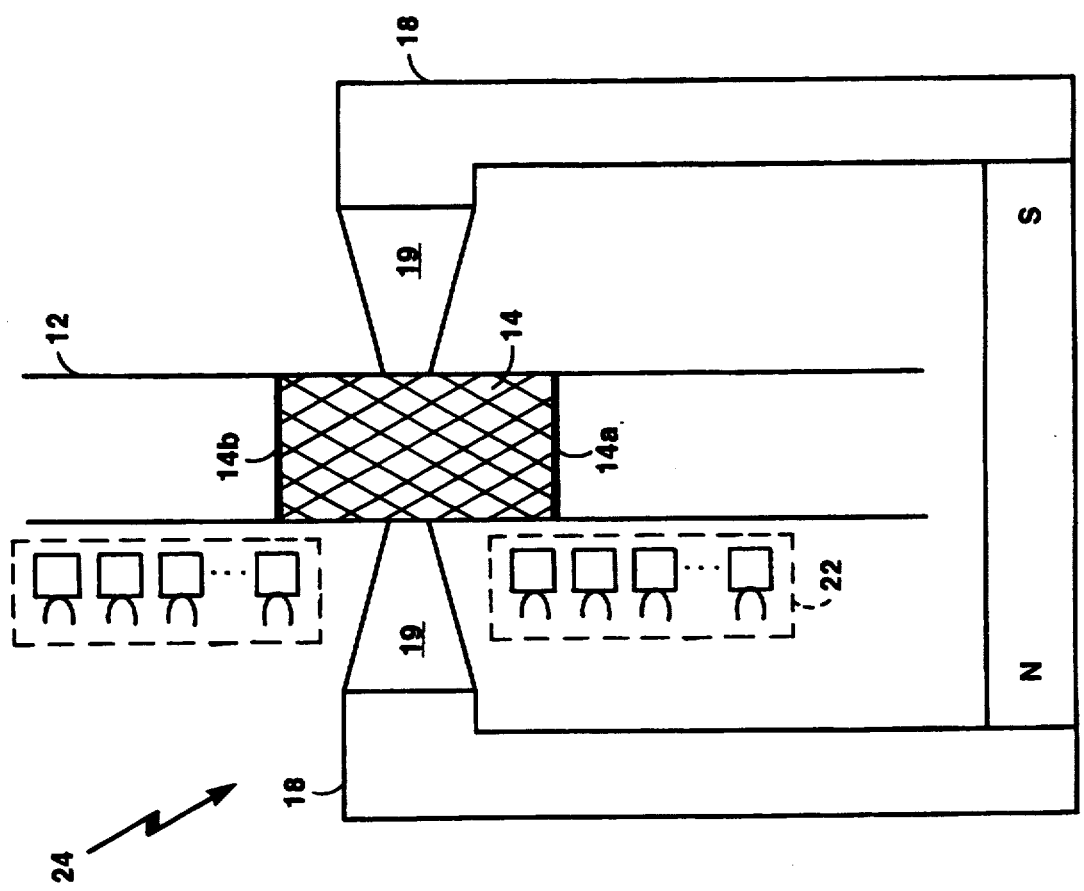
FIG. 3 depicts an alternative configuration of the differential pressure sensor. The sensing elements may be devices for measuring the Hall effect at either or both ends of the ferrofluid slug or may instead be photodiodes, with an associated light source (not shown).

FIG. 3 depicts an alternative configuration of the differential pressure sensor. The sensing elements 22 and 24 may be devices for measuring the Hall effect at either or both of the ends of the ferrofluid slug or may instead be photodiodes, with an associated light source (not shown). As discussed above, the sensing elements produce signals related to the position of the ferrofluid slug. These signals are then applied to a bridge circuit or some other type of known circuit which produces an associated output signal that varies with the signals produced by the sensing elements, and thus, with the differential pressure.

The relationship between the pressure differential, $\Delta P$, acting on the slug 14 and the displacement of the slug is given by $$\Delta P = kM[H_2(x) - H_1(x)] \quad (1)$$

where M is the magnetization of the ferrofluid, $H_1(x)$ and $H_2(x)$ are the magnetic field values at the ends 14a and 14b, respectively, of the ferrofluid slug 14 and are functions of x, which is the distance along the axis 13 from the center line 20, and k is a constant. Assuming field symmetry about the center line 20, when the pressure differential is zero, $H_2(x) = H_1(x)$ and the slug 14 is therefore centered on the center line 20. When the pressures at the ends 12a and 12b of the tube 12 differ, the ferrofluid slug 14 is displaced in response thereto as shown in FIG. 3. The magnetic field value at one end of the slug increases, as that end moves closer to the center line 20, and the magnetic field value at the other end decreases, as that end moves farther from the center line. The slug 14 comes to rest when the difference in the field strengths satisfies the condition expressed in formula (1). It will be apparent that the pressure capacity of the transducer is reached when one end of the slug 14 reaches the center line 20, i.e., the center of the tapered magnetic field.

If the differential pressure is greater than the pressure capacity, the ferrofluid slug 14 ruptures, or tears, along the interface between the outer surface of slug 14 and the inner wall 12c of the tube 12. The two ends of the tube 12 are therefore connected and the pressures tend to equalize. Once the differential pressure falls below the pressure capacity, the ferrofluid slug again spans the tube 12 and the slug moves in accordance with formula (1). Thus, pressures above the capacity of the sensor do not damage it.

If the sensor is to be used to measure very small pressure differentials, the sensor should have a relatively long slug 14, since the long slug will move a larger distance in response to a small pressure differential. The magnetic forces on the respective ends of a long slug which is centered in the tapered field are less than the forces are on a shorter slug. Accordingly, a small movement of the long slug results in a slight change in the net magnetic forces at the ends of the slug. Thus the slug will move a relatively long distance in response to even a small pressure differential.

The strength of the magnet 16, the shape of the pole pieces 18 and the length of the ferrofluid slug 14, as well as the type of ferrofluid used, may be tailored to adjust the operating parameters of the sensor to desired pressure ranges, temperature ranges, and so forth. If quick response time is important, a ferrofluid with low viscosity should be used.

The sensor is easy to manufacture and assemble. Further, it is rugged. The ferrofluid slug will not crack, fracture or become permanently disabled if the sensor is subjected to a shock, and the tube is easily made unbreakable.

The foregoing description has been limited to a specific embodiment of this invention. It will be apparent, however, that variations and modifications may be made to the invention, with the attainment of some or all of its advantages. Therefore, it is the object of the appended claims to cover all such variations and modifications as come within the true spirit and scope of the invention.

What is claimed is:

1. A differential pressure sensor including:
 A. a nonmagnetic tube with a first end, a second end and a longitudinal axis;
 B. a magnet proximate to the tube for providing a magnetic field through the tube which is generally perpendicular to the longitudinal axis of the tube and has a maximum flux density at a center, the magnet including tapered pole pieces, which provide a tapered magnetic field that has maximum magnetic flux density at the center and decreasing magnetic flux densities in both axial directions;
 C. a ferrofluid slug contained in the tube so as to be displaced in response to a pressure differential between the first end and second end of the tube; and
 D. a first pickup coil positioned along the tube and enclosing an end of the ferrofluid slug;
whereby the position of the slug in the magnetic field is a function of the pressure differential and changes in the position of the slug alters the inductance the pickup coil.

2. The differential pressure sensor of claim 1 further including a bridge circuit formed with the first pickup coil, said bridge circuit producing, in response to an applied voltage, an output signal which varies with a change in the inductance of the first pickup coil.

3. The differential pressure sensor of claim 1 further including a second pickup coil positioned along the tube and enclosing an end of the ferrofluid slug that is opposite the end enclosed by the first pickup coil.

4. The differential pressure sensor of claim 3 further including a bridge circuit formed with the first and the second pickup coils, said bridge circuit producing, in response to an applied voltage, an output signal which varies with a change in the relative inductances of the pickup coils.

5. The differential pressure sensor of claim 3 further including an oscillator circuit formed with the first and second pickup coils, said oscillator circuit producing, in response to an applied voltage, an output signal which varies with a change in the relative inductances of the pickup coils.

6. A differential pressure sensor including:
 A. a nonmagnetic tube with a first end, a second end and a longitudinal axis;
 B. a magnet proximate to the tube for providing a magnetic field through the tube which is generally perpendicular to the longitudinal axis of the tube and has a maximum flux density at a center and decreasing magnetic flux densities in both axial directions;
 C. a ferrofluid slug contained in the tube so as to be displaced in response to a pressure differential between the first end and second end of the tube; and D. a first sensing element positioned along the tube and enclosing an end of the ferrofluid slug whereby the position of the slug in the magnetic field is a function of the pressure differential and changes in the position of the slug alters the output of the sensing element.

7. The sensor of claim 6, wherein the sensing element senses Hall effects produced at the end of the slug.

8. The sensor of claim 7, wherein the sensing element comprises a plurality of photodiodes and a light source.

9. sensor of claim 6 further including a second sensing element positioned along the tube and enclosing an end of the ferrofluid slug that is opposite the end enclosed by the first sensing elements.

* * * * *